United States Patent
Cai et al.

(10) Patent No.: US 11,379,063 B2
(45) Date of Patent: Jul. 5, 2022

(54) ORGANIC LIGHT-EMITTING DISPLAY PANEL AND FABRICATION METHOD THEREOF

(71) Applicants: Shanghai Tianma Micro-Electronics Co., Ltd., Shanghai (CN); Tianma Micro-Electronics Co., Ltd., Shenzhen (CN)

(72) Inventors: Yu Cai, Shanghai (CN); Xuening Liu, Shanghai (CN); Heeyol Lee, Xiamen (CN); Quanpeng Yu, Shanghai (CN); Conghui Liu, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 16/678,513

(22) Filed: Nov. 8, 2019

(65) Prior Publication Data
US 2020/0073496 A1 Mar. 5, 2020

Related U.S. Application Data

(63) Continuation of application No. 15/401,821, filed on Jan. 9, 2017, now Pat. No. 10,503,327.

(30) Foreign Application Priority Data

Sep. 22, 2016 (CN) .......................... 201610844166.0

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *G06F 3/04164* (2019.05);
(Continued)

(58) Field of Classification Search
None
See application file for complete search history.

(56) References Cited

U.S. PATENT DOCUMENTS

2012/0097424 A1*  4/2012  Jo ........................ G02F 1/13439
                                                  174/126.4
2012/0194453 A1*  8/2012  Kim .................... G06F 3/04164
                                                  345/173

(Continued)

FOREIGN PATENT DOCUMENTS

| CN | 103309506 A | 9/2013 |
| CN | 104576970 A | 4/2015 |
| CN | 104679369 A | 6/2015 |

*Primary Examiner* — Christopher R Lamb
(74) *Attorney, Agent, or Firm* — Anova Law Group, PLLC

(57) ABSTRACT

An organic light-emitting display panel and fabrication method thereof are provided. The organic light-emitting display panel includes an organic light-emitting element array substrate, a thin film encapsulation layer covering the organic light-emitting element array substrate, and touch-control electrodes. The thin film encapsulation layer includes at least one inorganic layer and at least one organic layer. First groove structures are configured in at least one organic layer, and sidewalls of the first groove structures are arc-shaped. The touch-control electrodes are disposed in the first groove structures.

20 Claims, 12 Drawing Sheets

(51) Int. Cl.
*H01L 27/32* (2006.01)
*H01L 51/52* (2006.01)
(52) U.S. Cl.
CPC .............. *G06F 2203/04102* (2013.01); *G06F 2203/04103* (2013.01); *G06F 2203/04112* (2013.01); *H01L 27/323* (2013.01); *H01L 51/5253* (2013.01)

(56) References Cited

U.S. PATENT DOCUMENTS

| | | |
|---|---|---|
| 2014/0145979 A1 | 5/2014 | Lee |
| 2014/0295127 A1* | 10/2014 | Tang ................... G06F 3/0446 428/67 |
| 2014/0327844 A1* | 11/2014 | Hwang ................. B32B 37/18 349/12 |
| 2014/0354901 A1 | 12/2014 | Zhao et al. |
| 2015/0060252 A1 | 3/2015 | Wang et al. |
| 2016/0103532 A1 | 4/2016 | Jaw et al. |
| 2016/0154499 A1* | 6/2016 | Bae ..................... G06F 3/04166 345/174 |
| 2016/0219697 A1* | 7/2016 | Bae ..................... H05K 3/0011 |

* cited by examiner

ORGANIC LIGHT-EMITTING DISPLAY PANEL AND FABRICATION METHOD THEREOF

CROSS-REFERENCE TO RELATED APPLICATIONS

This application is a continuation of U.S. patent application Ser. No. 15/401,821, filed on Jan. 9, 2017, which claims the priority of Chinese Patent Application No. 201610844166.0, filed on Sep. 22, 2016, the entire contents of all of which are hereby incorporated by reference.

FIELD OF THE INVENTION

The present disclosure generally relates to the field of touch-control display technology and, more particularly, relates to an organic light-emitting display panel and a fabrication method thereof.

BACKGROUND

With the rapid development of the display technology, great breakthroughs have been achieved not only in the dimension of the display panels, but also the display quality. As an important development direction of the display technology, the flexible display devices have attracted wide attention because of their lightweight, thin thickness, and flexibility. Flexible touch-control display panels combine the advantages of the touch-control technique and the flexible display technique, thus showing a feature of being transformable in shape or flexibility. Further, the flexible touch-control display panels may be operated directly by a user using a finger or a stylus, etc., which is very comfortable and convenient, thus drawing people's wide attention.

The touch-control electrodes in the current flexible touch-control display panels are often externally attached, or integrated in an external auxiliary film in the following ways. In an existing method, the touch-control electrodes are externally attached to the flexible display panels. However, this method often fails to realize the thinning of the flexible touch-control display panels. In another existing method, the touch-control electrodes are integrated on the polarizer or the cover plate. Although this method may reduce the thickness of the flexible touch-control display panel to some extent, the fabrication requirements of the polarizer and the cover plate are relatively high.

Further, when the above-described flexible touch-control display panels are bent, cracks may easily occur on the surface. The cracks may easily extend and propagate, and often lead to the fracture of the touch-control electrodes, which eventually results in failure of the touch-control function. Thus, the flexible touch-control display panels need to be further improved to enhance the reliability.

The disclosed organic light-emitting display panel and fabrication method thereof are directed to solving at least partial problems set forth above and other problems.

BRIEF SUMMARY OF THE DISCLOSURE

One aspect of the present disclosure provides an organic light-emitting display panel. The organic light-emitting display panel includes an organic light-emitting element array substrate, a thin film encapsulation layer covering the organic light-emitting element array substrate, and touch-control electrodes. The thin film encapsulation layer includes at least one inorganic layer and at least one organic layer. First groove structures are configured in at least one organic layer, and sidewalls of the first groove structures are arc-shaped. The touch-control electrodes are disposed in the first groove structures.

Another aspect of the present disclosure provides a method for fabricating an organic light-emitting display panel. The method includes forming an organic light-emitting element array substrate, and forming a thin film encapsulation layer on the organic light-emitting element array substrate. The method further includes configuring first groove structures in at least one organic layer, and forming touch-control electrodes in the first groove structures. In particular, forming the thin film encapsulation layer on the organic light-emitting element includes forming at least one inorganic layer and at least one organic layer. Sidewalls of the first groove structures are arc-shaped;

Other aspects of the present disclosure can be understood by those skilled in the art in light of the description, the claims, and the drawings of the present disclosure.

BRIEF DESCRIPTION OF THE DRAWINGS

Other features, goals and advantages of the present disclosure will become more apparent from a reading of the following detailed description of non-limiting embodiments with reference to the accompanying drawings.

DETAILED DESCRIPTION

Figure 1A:
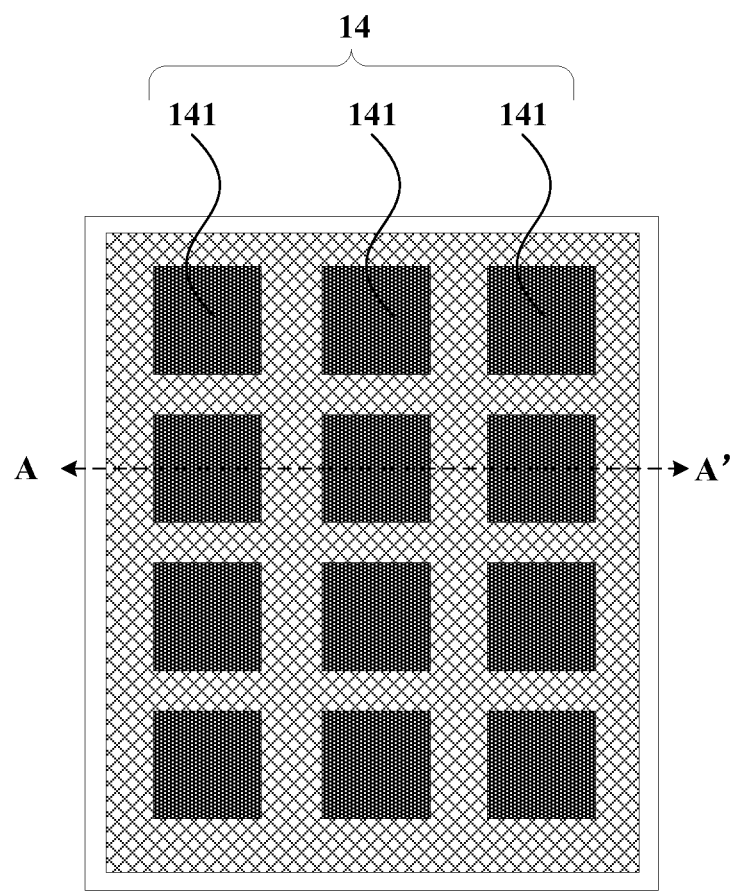
FIG. 1A illustrates a top view of an exemplary organic light-emitting display panel consistent with disclosed embodiments.

The present disclosure will now be described in more detail hereinafter with reference to the accompanying drawings and embodiments. It should be understood that, the exemplary embodiments described herein are for illustrative purpose only, and are not intended to limit the present disclosure. In addition, it should be noted that, for ease of description, the accompanying drawings merely illustrate a part of, but not all structures related to the present disclosure.

As discussed above, when existing flexible touch-control display panel are bent, cracks may easily occur on the surface of the display panel. The cracks may extend and propagate, and often lead to the fracture of the touch-control electrodes, which eventually results in failure of the touch-control function.

Directed to solving at least partial problems set forth above and other problems, the present disclosure provides an improved organic light-emitting display panel and fabrication method thereof. According to the present disclosure, by configuring the touch-control electrodes in first groove structures in an organic layer of the thin film encapsulation layer, the risk of the touch-control electrodes being fractured in the bending process may be significantly reduced. Further, because the sidewalls of the first groove structures are arc-shaped, the touch-control electrodes disposed in the first groove structures may have a relatively smooth and fitting contact with the first groove structures. Accordingly, stress concentration at the sidewalls of the first groove structures may be avoided, and the risk of the touch-control electrodes being fractured may be further reduced.

The present disclosure provides an organic light-emitting display panel including an organic light-emitting element array substrate, and a thin film encapsulation layer covering the organic light-emitting element array substrate. In particular, the thin film encapsulation layer may include at least one inorganic layer and at least one organic layer. First groove structures may be disposed in at least one organic layer, and sidewalls of the first groove structures may be arc-shaped. The organic light-emitting display panel may also include touch-control electrodes, and the touch-control electrodes may be disposed in the first groove structures.

The organic light-emitting elements in the organic light-emitting display panels may be sensitive to external environment factors such as water vapor and oxygen. Thus, if the organic light-emitting elements in the organic light-emitting display panels are exposed in an environment comprising water vapor or oxygen, the performance of the organic light-emitting display panels would be dramatically decreased or completely deteriorated. To elongate the service life and improve the stability of the organic light-emitting display panels, a thin film encapsulation layer may need to be disposed and cover the organic light-emitting elements for encapsulation. The thin film encapsulation layer may be a structure including at least one inorganic layer and at least one organic layer.

In the present disclosure, by configuring the touch-control electrodes in the thin film encapsulation layer, the corrosion of the touch-control electrodes induced by external water vapor, oxygen, etc. may be avoided. At the same time, the thickness of the organic light-emitting display panels may not be increased continuously, which satisfies the thinning development trend of the organic light-emitting display panels. Further, by configuring the touch-control electrodes in the first groove structures in an organic layer of the thin film encapsulation layer, the risk of the touch-control electrodes being fractured in the bending process may be significantly reduced. Further, because the sidewalls of the first groove structures are arc-shaped, the touch-control electrodes disposed in the first groove structures may have a relatively smooth and fitting contact with the first groove structures. Accordingly, the stress concentration at the sidewalls of the first groove structures may be avoided, and the risk of the touch-control electrodes being fractured during the bending process may be further reduced.

The technical solutions in the embodiments of the present disclosure will be described as follows in a clear and complete manner with reference to the accompanying drawings in the embodiments of the present disclosure. On the basis of the embodiments of the present disclosure, all other embodiments obtainable by persons ordinarily skilled in the art without creative effort shall all fall within the protection scope of the present disclosure.

Figure 1B:
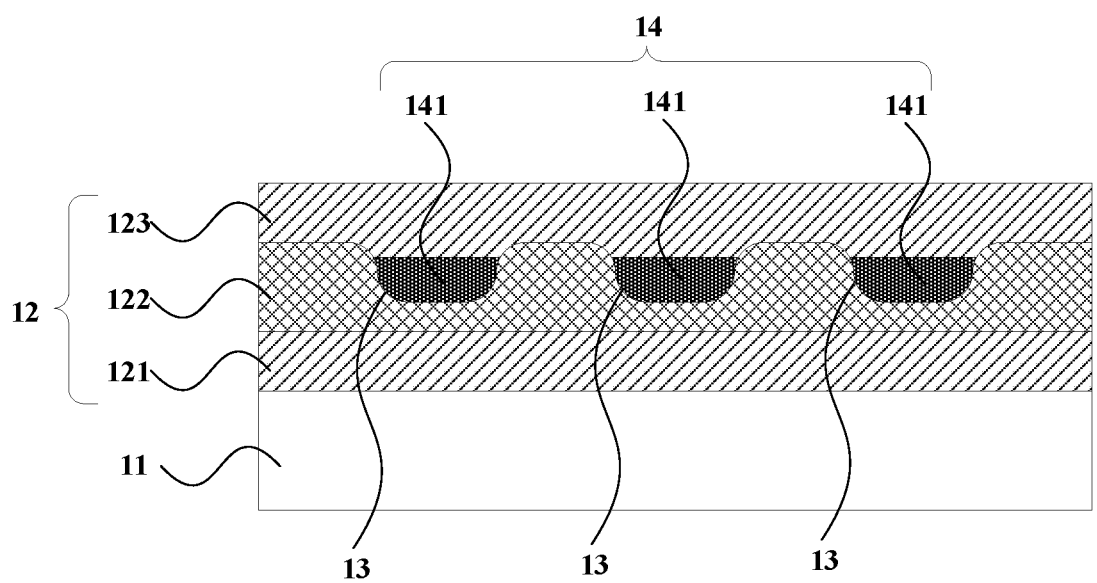
FIG. 1B illustrates an AA' cross-sectional view of FIG. 1A consistent with disclosed embodiments.

FIG. 1A illustrates a top view of an exemplary organic light-emitting display panel consistent with disclosed embodiments. FIG. 1B illustrates an AA' cross-sectional view of FIG. 1A consistent with disclosed embodiments. As shown in FIG. 1A and FIG. 1B, the organic light-emitting display panel may include an organic light-emitting-element array substrate 11, a thin film encapsulation layer 12 covering the organic light-emitting-element array substrate 11, and touch-control electrodes 14. In particular, the thin film encapsulation layer 12 may include at least one inorganic layer and at least one organic layer In one embodiment, referring to FIG. 1B, the thin film encapsulation layer 12 may include two inorganic layers and one organic layer. Specifically, the thin film encapsulation layer 12 may include a first inorganic layer 121, a first organic layer 122, and a second inorganic layer 123. In particular, the first organic layer 122 may be sandwiched between the first inorganic layer 121 and the second inorganic layer 123. First groove structures 13 may be disposed in the first organic layer 122, and the touch-control electrodes 14 may be disposed in the first groove structures 13.

Further, the disclosed organic light-emitting display panel may be a self-capacitive touch-control display panel. That is, the touch-control electrodes 14 may include a plurality of touch-control electrode blocks 141, and the plurality of touch-control electrode blocks 141 may be disposed in the first groove structures 13 in the same organic layer (i.e., the first organic layer 122). Each touch-control electrode block 141 may form a capacitor with the ground, and a touch location may be determined by detecting the capacitance feedbacked by the plurality of touch-control electrode blocks 141. The plurality of touch-control electrode blocks 141 may, for example, be transparent and conductive thin films made of indium tin oxide (ITO), etc.

In one embodiment, the self-capacitive touch-control electrodes may be disposed inside the thin film encapsulation layer 12. Thus, the thin film encapsulation layer 12 originally in the organic light-emitting display panel may be utilized to protect the touch-control electrodes 14. Accordingly, corrosion of the touch-control electrodes 14 induced by the water vapor and oxygen, etc. from an external environment may be avoided. Further, instead of individually attaching touch-control electrodes on the external side of the organic light-emitting display panel, the present disclosure may configure the self-capacitive touch-control electrodes 14 inside the thin film encapsulation layer 12. Accordingly, the thickness of the disclosed self-capacitive touch-control organic light-emitting display panel may remain nearly unchanged, thus better satisfying the current thinning development trend of the organic light-emitting display panels.

Further, if the organic light-emitting element array substrate 11 includes a flexible substrate, because the touch-control electrodes 14 are disposed in the first groove structures 13, the configuration of the first groove structures 13 may enhance the bending performance of the organic light-emitting display panel. Accordingly, the risk of the touch-control electrode 14 being fractured may be reduced to some extent. Further, because the sidewalls of the first groove structures 13 are configured to be arc-shaped, when the touch-control electrodes 14 are disposed in the first groove structures 13, the touch-control electrodes 14 may have a relatively smooth and fitting contact with the first groove structures 13. Thus, no sharp and abrupt steps may occur in the contact locations between the touch-control electrodes 14 and the first groove structures 13. Accordingly, the stress may be prevented from concentrating at the steps, and the bending performance of the organic light-emitting display panel may be further improved.

Optionally, the arc-shaped sidewalls of the first groove structures may be configured to be convex arc-shaped. The first groove structures may be formed simultaneously with the organic layer via an ink-jet printing process. Because the ejected ink droplets may converge and aggregate, the shape of the first groove structures in the organic layer may be controlled by adjusting the curing duration, curing temperature, as well as speed and size of the ejected ink droplets during ink-jet printing. By configuring the arc-shaped sidewalls of the first groove structures to be convex arc-shaped, the touch-control electrode material may be more conveniently formed on the bottom and sidewalls of the first groove structures when the touch-control electrodes are formed in the first groove structures. If the touch-control electrodes are also formed via the ink-jet printing process, because the arc-shaped sidewalls of the first groove structures are convex arc-shaped, the flow of the ejected droplets may be accelerated when the touch-control electrodes are ink-jet printed. Accordingly, the pattern of the touch-control electrodes may be formed rapidly.

Optionally, in one embodiment, the depth of the first groove structures may be configured to be greater than the thickness of the touch-control electrodes. If the bottom of the first groove structures is not flat, then the depth of the first groove structures in different locations may be different. The depth of the first groove structures greater than the thickness of the touch-control electrodes may refer to a situation where the touch-control electrodes do not fill up the first groove structures along a depth direction of the first groove structures.

By configuring the depth of the first groove structures to be greater than the thickness of the touch-control electrodes, damages to the touch-control electrodes caused by an external force or blast may be avoided. Optionally, the depth of the first groove structures may be configured to be within the range of approximately 0.3-16 µm. The width of each groove in the first groove structures may be greater than the width of the corresponding touch-control electrode disposed in each groove. Accordingly, the touch-control electrodes may be prevented from extruding the first groove structures.

Figure 2A:
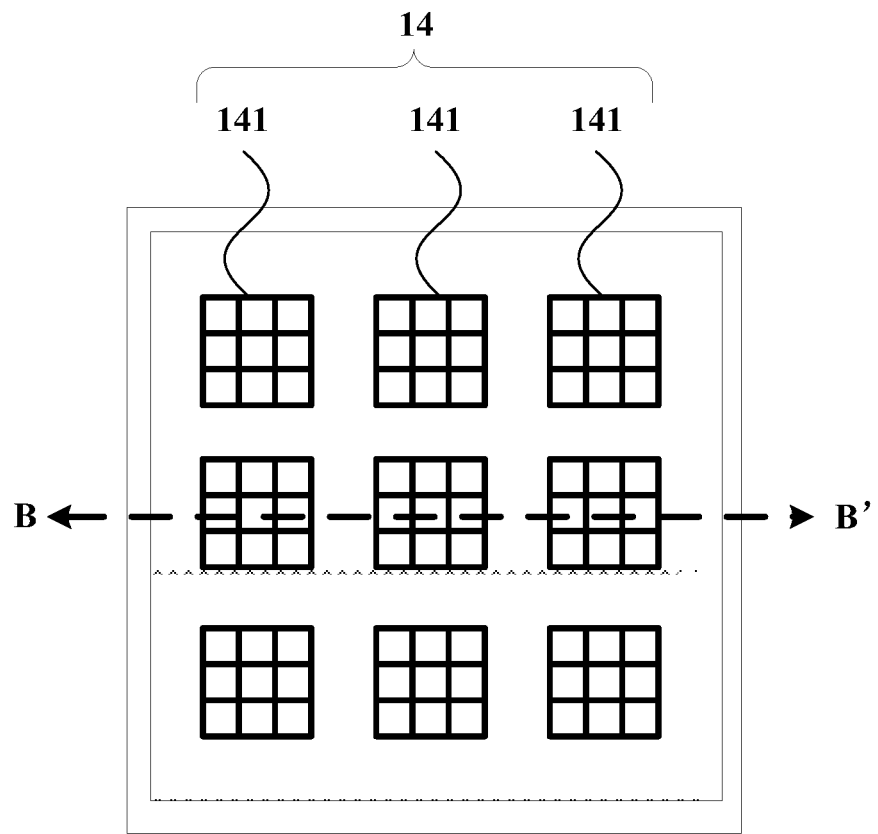
FIG. 2A illustrates a top view of another organic light-emitting display panel consistent with disclosed embodiments.
Figure 2B:
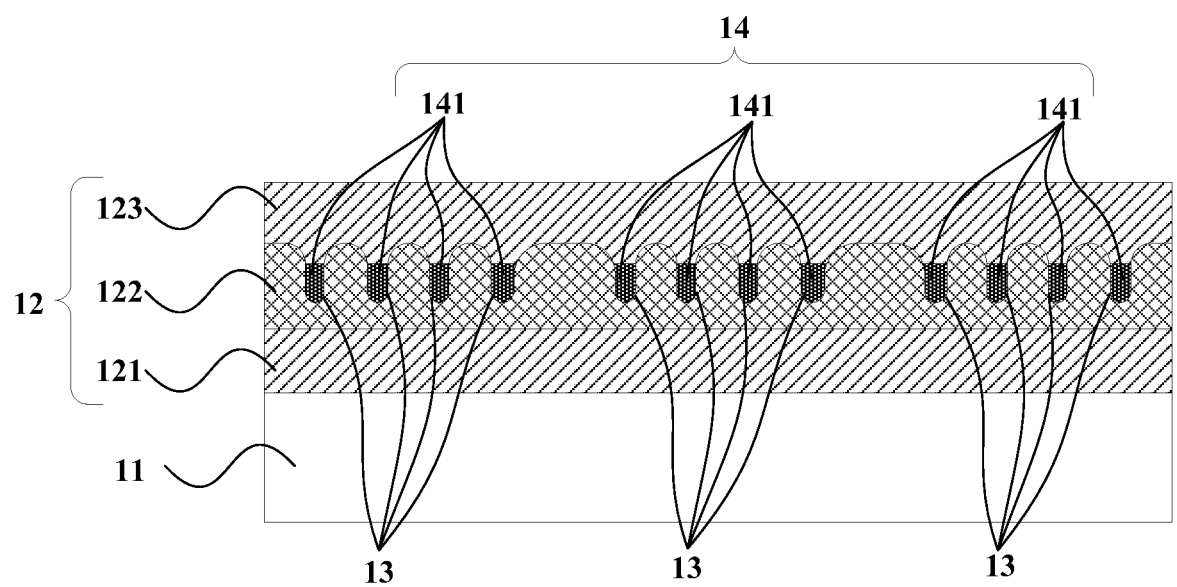
FIG. 2B illustrates a BB' cross-sectional view of FIG. 2A consistent with disclosed embodiments.

FIG. 2A illustrates a top view of another organic light-emitting display panel consistent with disclosed embodiments. FIG. 2B illustrates a BB' cross-sectional view of FIG. 2A consistent with disclosed embodiments. Different from FIG. 1A and FIG. 1B, as shown in FIG. 2A and FIG. 2B, in one embodiment, the disclosed touch-control electrodes 14 may be grid-patterned metal wires. The disclosed organic light-emitting display panel may also be a self-capacitive touch-control structure. In particular, the touch-control electrodes 14 may be disposed in the first groove structures 13 of the first organic layer 122. The first groove structures 13 may have the same shape as the touch-control electrodes 14. That is, the orthographic projections of the first groove structures 13 on the organic light-emitting element array substrate 11 may be in a grid pattern.

In other embodiments, the orthographic projections of the first groove structures 13 on the organic light-emitting element array substrate 11 may be blocks, and the touch-control electrodes 14 disposed in the first groove structures 13 may be grid-patterned metal wires. As shown in FIG. 2B, the shape of the first grooves structures 13 may be the same as the shape of the touch-control electrodes 14. That is, the orthographic projections of the first groove structures 13 on the organic light-emitting element array substrate 11 may be in a grid pattern.

In the present disclosure, by configuring the touch-control electrodes 14 to be grid-patterned metal wires, the impedance of the touch-control electrodes 14 may be reduced and the touch-control sensitivity may be improved. Further, because the touch-control electrodes are grid-patterned metal wires and grid-patterned metal wires have a good ductility, the anti-bending ability of the touch-control electrodes may be further improved.

In the present disclosure, the grid-patterned metal wire touch-control electrodes may be disposed in the first groove structures of the organic layer. During the bending process, if a crack occurs in one of the metallic wires in the grid-patterned metal wire touch-control electrodes, because of the blockage of the first groove structures, the crack may not propagate into other metallic wires. That is, the further propagation of the crack may be avoided. Because the grid-patterned metal wire touch-control electrodes are not disposed in the organic layer directly without first groove structures, the bending performance of the organic light-emitting display panel may be improved.

Figure 3A:
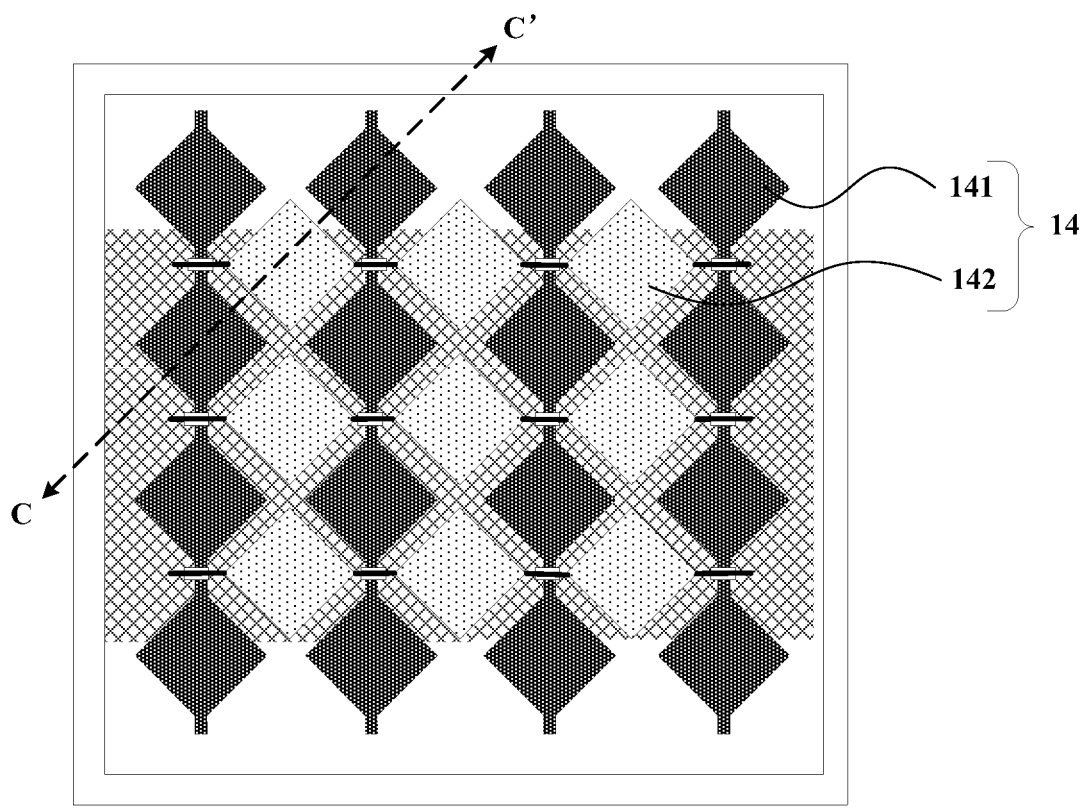
FIG. 3A illustrates a top view of another organic light-emitting display panel consistent with disclosed embodiments.
Figure 3B:
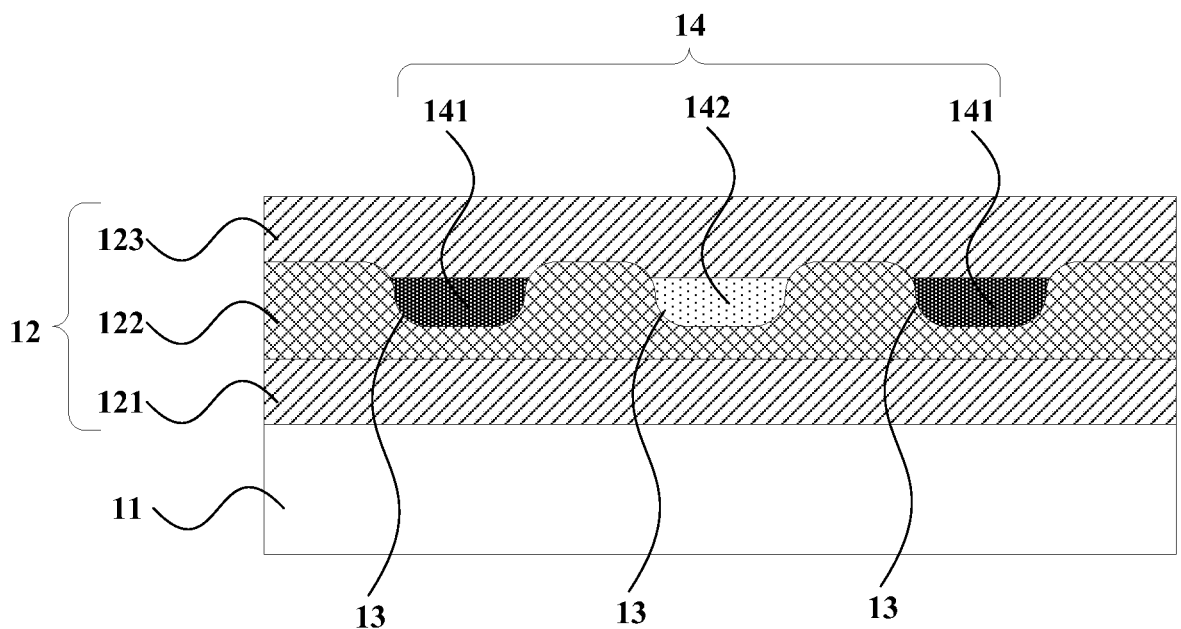
FIG. 3B illustrates a CC' cross-sectional view of FIG. 3A consistent with disclosed embodiments.

FIG. 3A illustrates a top view of another organic light-emitting display panel consistent with disclosed embodiments. FIG. 3B illustrates a CC' cross-sectional view of FIG. 3A consistent with disclosed embodiments. As shown in FIG. 3A and FIG. 3B, the touch-control electrodes 14 in the disclosed organic light-emitting display panel may include first touch-control electrodes 141 and second touch-control electrodes 142. The first touch-control electrodes 141 and the second touch-control electrodes 142 may be disposed in different first groove structures located in the same organic layer. Specifically, referring to FIG. 3B, the first touch-control electrodes 141 and the second touch-control electrodes 142 may be disposed in different first groove structures 13 in the first organic layer 122. The sidewalls of the first groove structures 13 may be arc-shaped.

In one embodiment, referring to FIG. 3A, the first touch-control electrodes 141 may be continuous in the column direction. That is, the first touch-control electrodes 141 may be connected to each other in the column direction. In the row direction, the first touch-control electrodes 141 may be isolated from each other. Because the first touch-control electrodes 141 and the second touch-control electrodes 142 are disposed in different first groove structures in the same organic layer, two adjacent second touch-control electrodes 142 in each row may be spaced apart by a column of the first touch-control electrodes 141 connected in the column direction. Further, each two adjacent second touch-control electrodes 142 spaced apart by a column of the first touch-control electrodes 141 in the same row may be electrically connected via a crossing bridge structure (not labeled). An insulation layer may be disposed in each overlapping region between the crossing bridge structures and the first touch-control electrodes 141, thus ensuring that the first touch-control electrodes 141 and the second touch-control electrodes 142 are mutually insulated.

The above-described organic light-emitting display panel may be suitable for mutual capacitive touch-control. For example, the first touch-control electrodes 141 may be touch-control driving electrodes, and the second touch-control electrodes 142 may be touch-control sensing electrodes. The touch-control driving electrodes and the touch-control sensing electrodes may form capacitors. Touch-control driving signals may be sequentially inputted to the touch-control driving electrodes, and the touch-control sensing electrode layer may simultaneously output touch-control detecting signals. When a touch-control occurs, the coupling between the touch-control driving electrodes and the touch-control sensing electrodes near the touch-control point may be affected. Thus, the capacitance between the touch-control driving electrodes and the touch-control sensing electrodes may be changed.

Specifically, the method to detect the location of the touch-control point may include sequentially inputting the touch-control driving signals to the touch-control driving electrodes, and simultaneously outputting the touch-control detecting signals by the touch-control sensing electrodes. Thus, the capacitance at all overlapping regions between the touch-control driving electrodes and the touch-control sensing electrodes may be obtained. That is, the capacitance over the whole two-dimensional plane may be obtained. Further, based on the data regarding the capacitance variance over the whole two-dimensional plane, the coordinates of the touch-control point may be calculated.

Figure 4A:
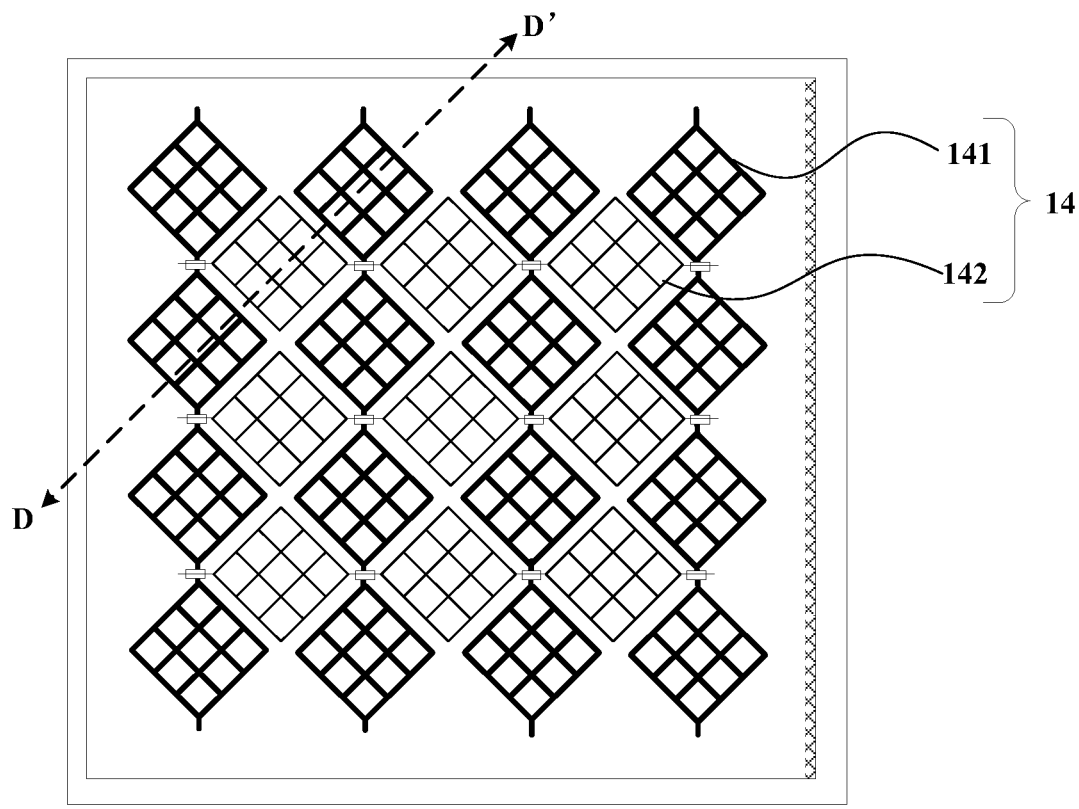
FIG. 4A illustrates a top view of another organic light-emitting display panel consistent with disclosed embodiments.
Figure 4B:
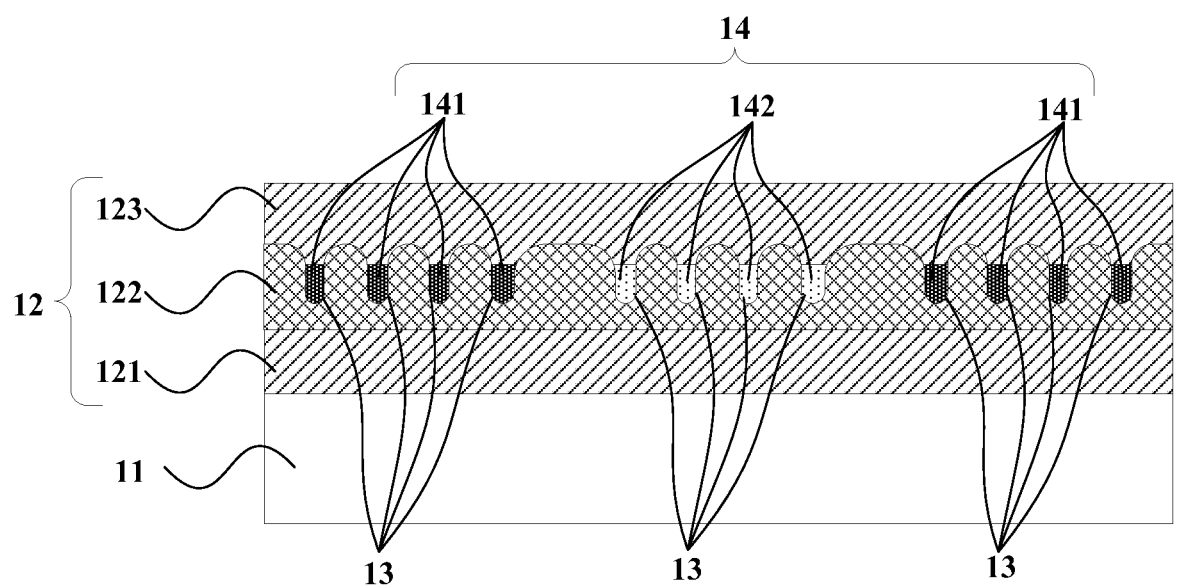
FIG. 4B illustrates a DD' cross-sectional view of FIG. 4A consistent with disclosed embodiments.

FIG. 4A illustrates a top view of another organic light-emitting display panel consistent with disclosed embodiments. FIG. 4B illustrates a DD' cross-sectional view of FIG. 4A consistent with disclosed embodiments. As shown in FIG. 4A and FIG. 4B, structures the same or similar to that in FIG. 3A and FIG. 3B may refer to the above descriptions and are not described any further here. In one embodiment, the first touch-control electrodes 141 and the second touch-control electrodes 142 may be transparent and conductive thin films made of ITO, etc. In another embodiment, as shown in FIG. 4A and FIG. 4B, the first touch-control electrodes 141 and the second touch-control electrodes 142 may be grid-patterned metal wires.

Figure 5A:
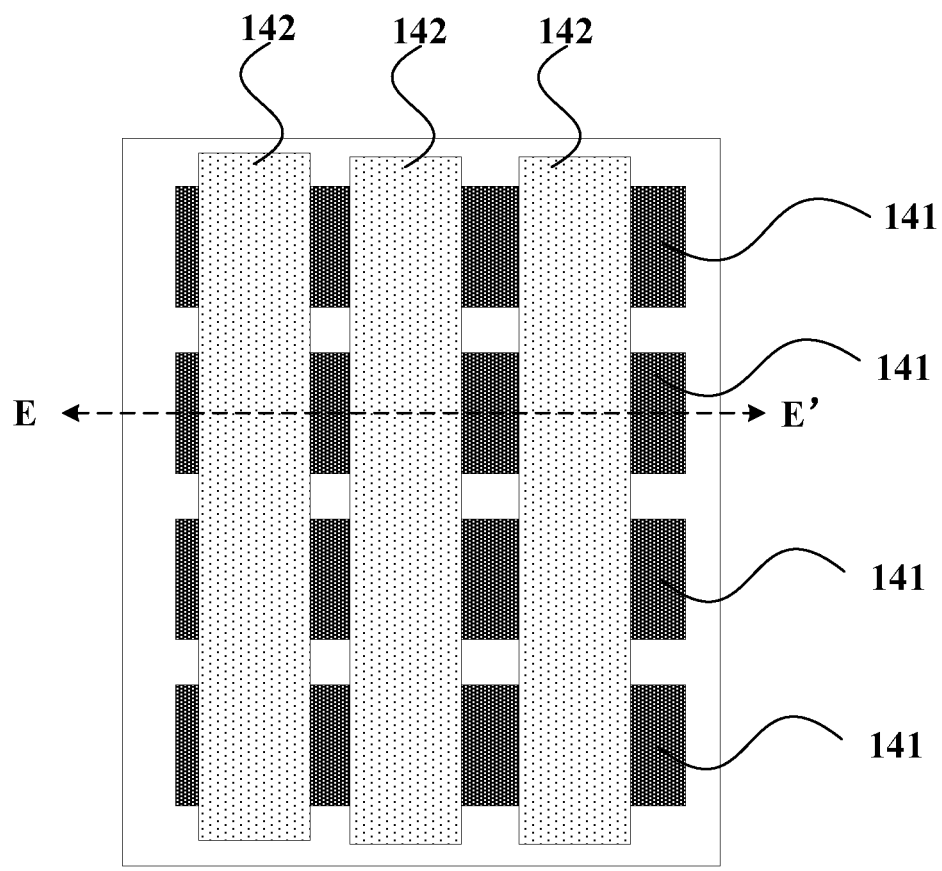
FIG. 5A illustrates a top view of another organic light-emitting display panel consistent with disclosed embodiments.
Figure 5B:
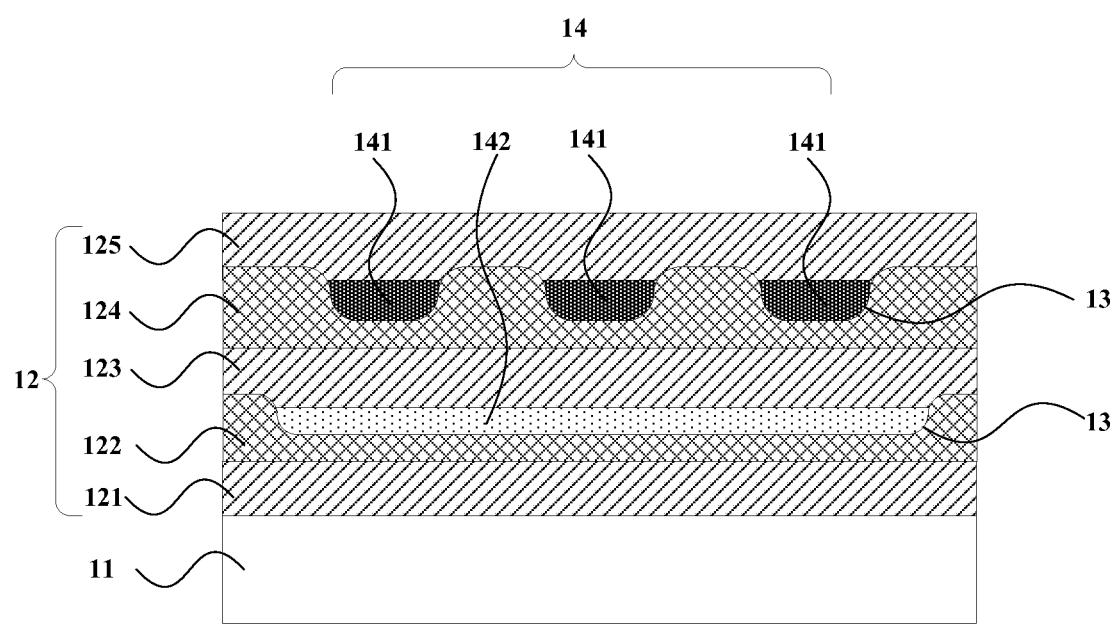
FIG. 5B illustrates an EE' cross-sectional view of FIG. 5A consistent with disclosed embodiments.

FIG. 5A illustrates a top view of another organic light-emitting display panel consistent with disclosed embodiments. FIG. 5B illustrates an EE' cross-sectional view of FIG. 5A consistent with disclosed embodiments. As shown in FIG. 5A and FIG. 5B, the organic light-emitting display panel may include the organic light-emitting element array substrate 11, and the thin film encapsulation layer 12 covering the organic light-emitting element array substrate 11. In particular, the thin film encapsulation layer 12 may include the first inorganic layer 121, the first organic layer 122, the second inorganic layer 123, a second organic layer 124, and a third inorganic layer 125. The touch-control electrodes 14 of the organic light-emitting display panel may include the first touch-control electrodes 141 and the second touch-control electrodes 142.

Further, the first touch-control electrodes 141 and the second touch-control electrodes 142 may be disposed in the first groove structures 13 in different organic layers. For example, as shown in FIG. 5A and FIG. 5B, the first touch-control electrodes 141 may be disposed in the first groove structures 13 in the second organic layer 124, and the second touch-control electrode 142 may be disposed in the first groove structure 13 in the first organic layer 122. The disclosed organic light-emitting display panel may also be a mutual capacitive touch-control display panel.

In one embodiment, as shown in FIG. 5A and FIG. 5B, the first touch-control electrodes 141 and the second touch-control electrodes 142 may be stripe-shaped. In particular, the sidewalls of the first groove structures 13 in the first organic layer 122 and the first groove structure 13 in the second organic layer 124 may all be arc-shaped.

Figure 6A:
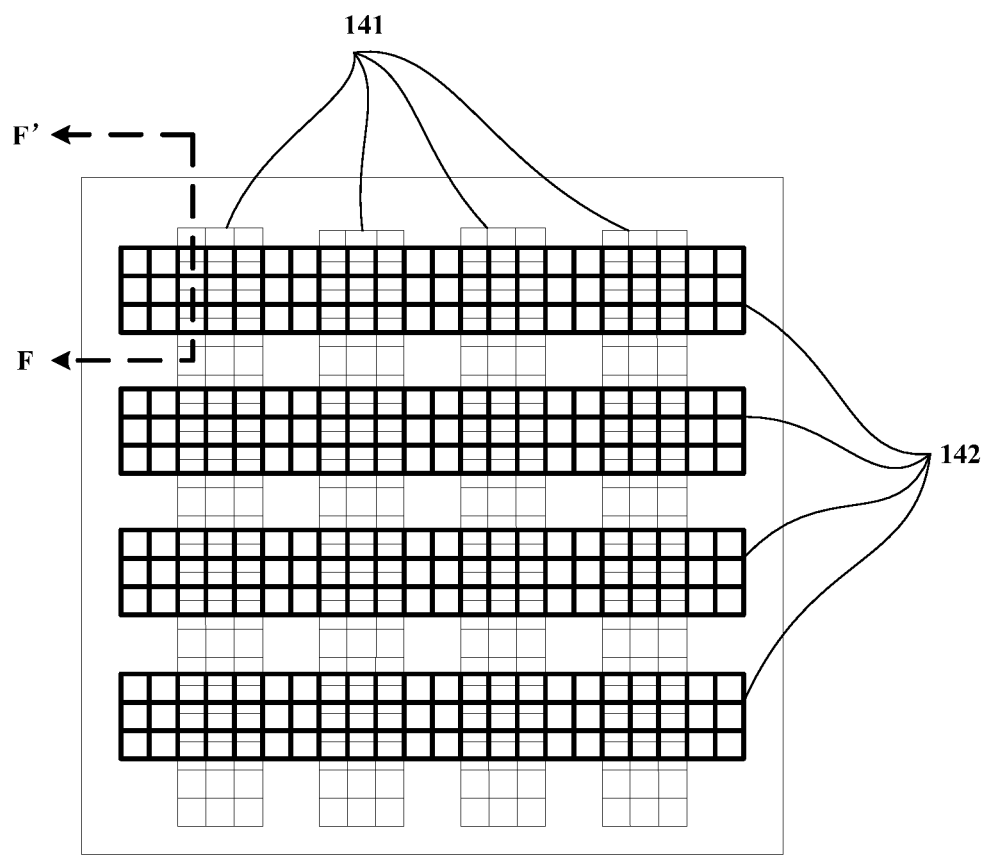
FIG. 6A illustrates a top view of another organic light-emitting display panel consistent with disclosed embodiments.
Figure 6B:
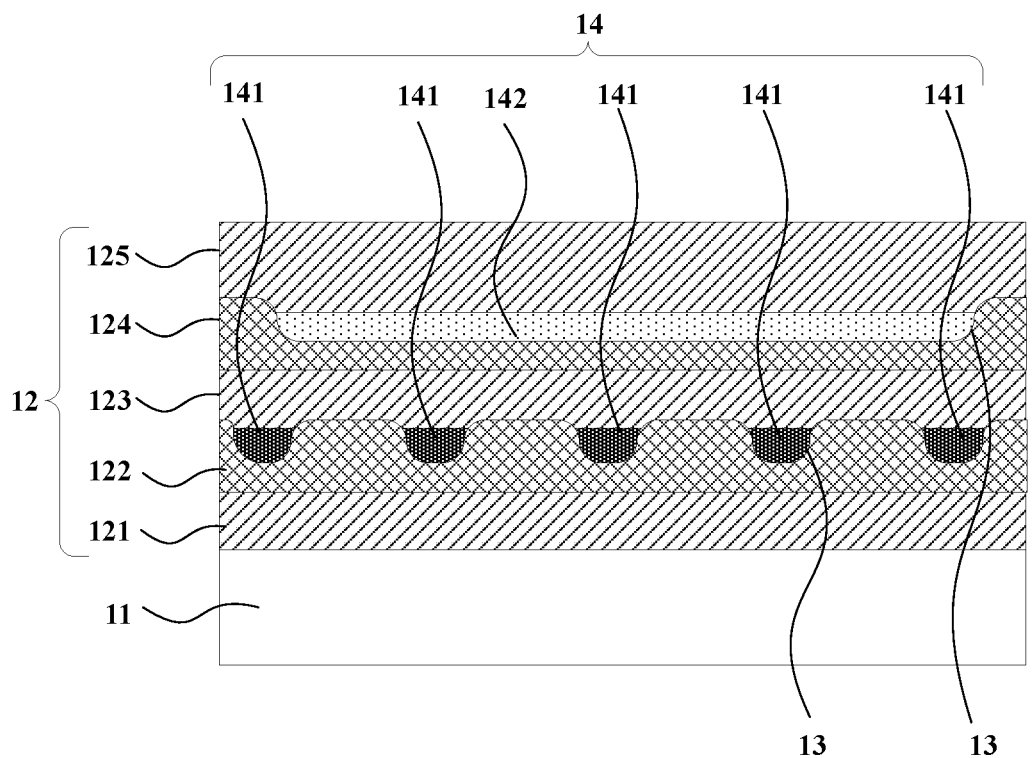
FIG. 6B illustrates an FF' cross-sectional view of FIG. 6A consistent with disclosed embodiments.

FIG. 6A illustrates a top view of another organic light-emitting display panel consistent with disclosed embodiments. FIG. 6B illustrates an FF' cross-sectional view of FIG. 6A consistent with disclosed embodiments. Different from FIG. 5A and FIG. 5B, as shown in FIG. 6A and FIG. 6B, the first touch-control electrodes 141 and the second touch-control electrodes 142 may all be grid-patterned metal wires. Optionally, the first groove structures 13 in the first organic layer 122 may have the same shape as the first touch-control electrodes 141. That is, the orthographic projection of the first groove structures 13 in the first organic layer 122 on the organic light-emitting element array substrate may be in a grid pattern. Optionally, the first groove structures 13 in the second organic layer 124 may have the same shape as the second touch-control electrodes 142. That is, the orthographic projection of the first groove structures 13 in the second organic layer 124 on the organic light-emitting element array substrate may be in a grid pattern.

Figure 7A:
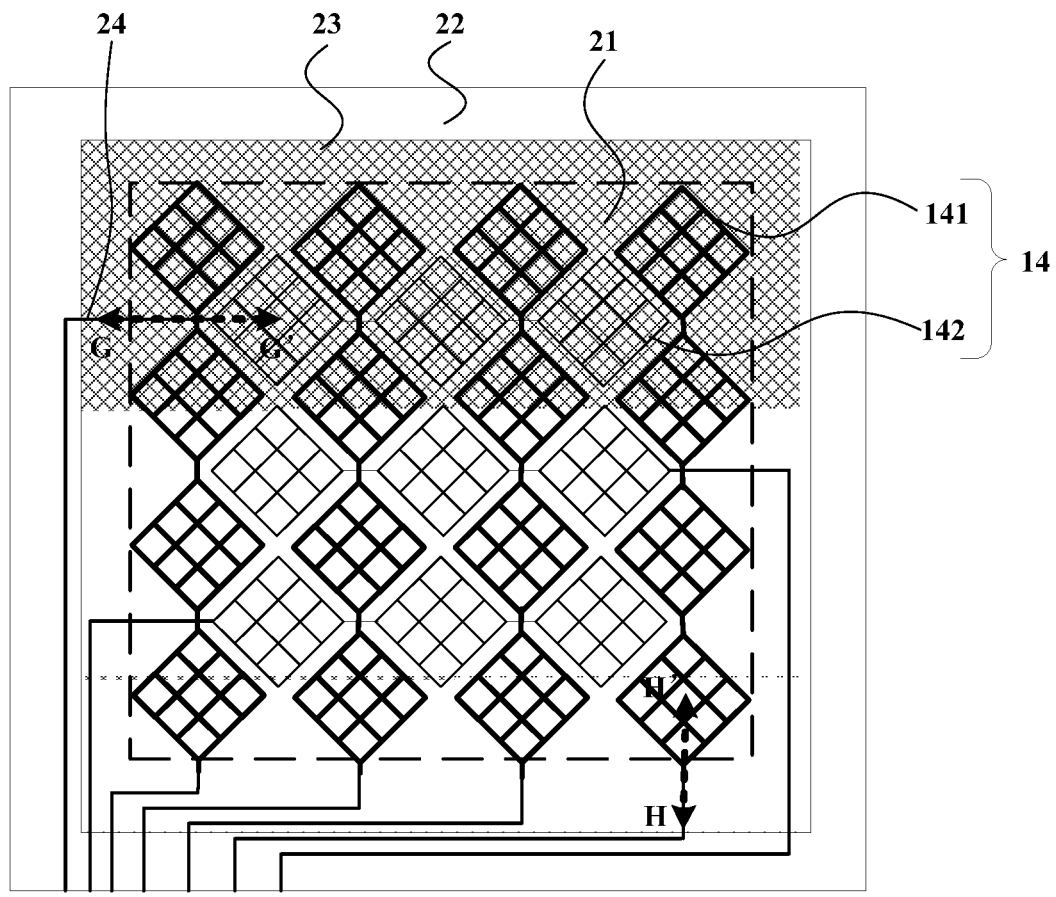
FIG. 7A illustrates a top view of another organic light-emitting display panel consistent with disclosed embodiments.
Figure 7B:
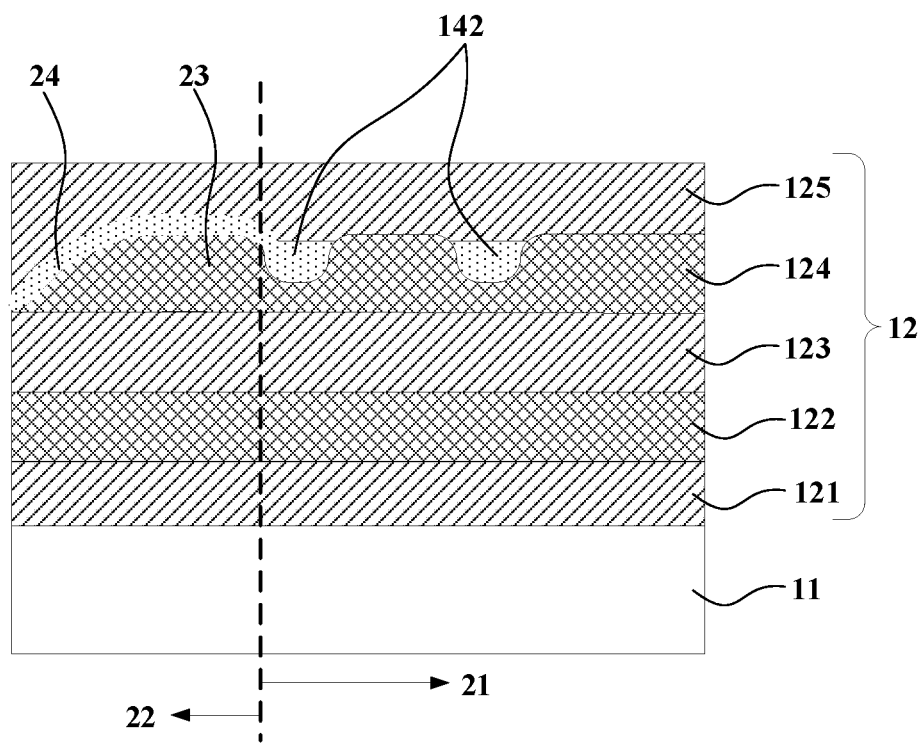
FIG. 7B illustrates a GG' cross-sectional view of FIG. 7A consistent with disclosed embodiments.
Figure 7C:
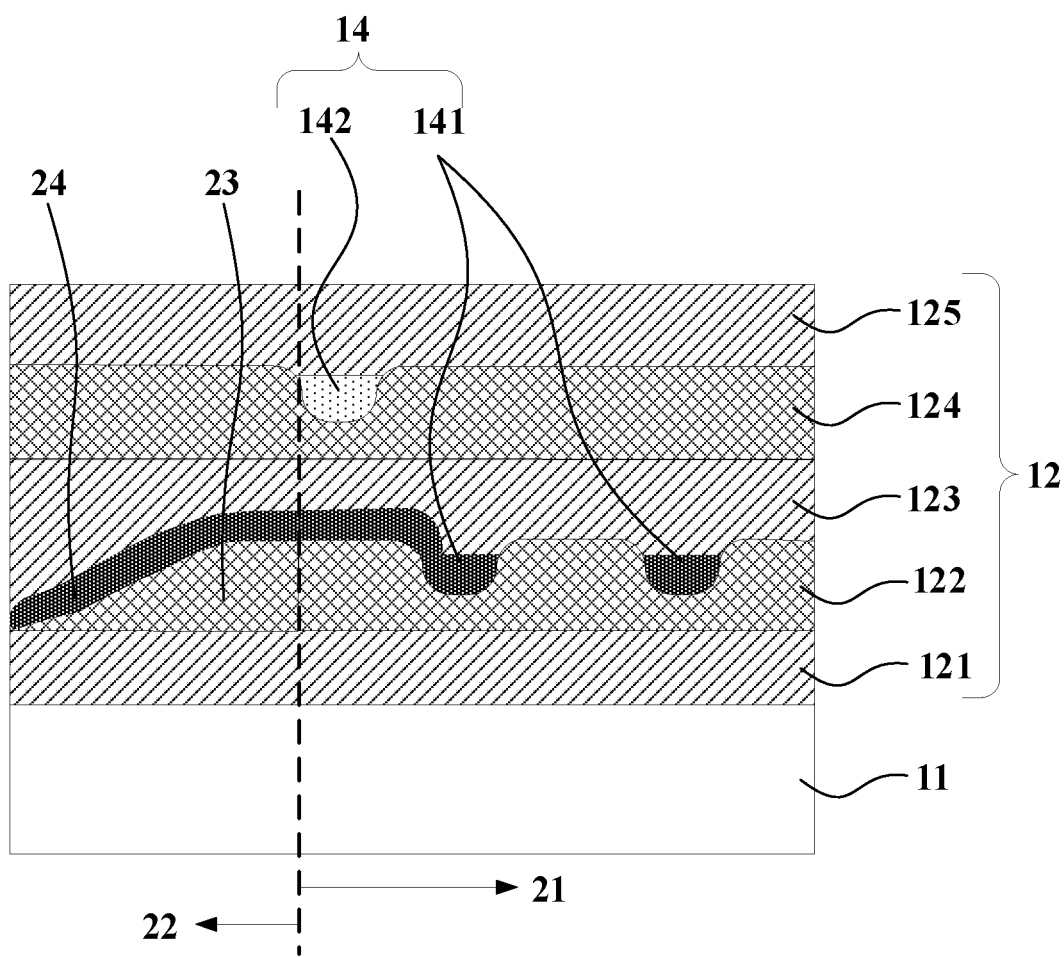
FIG. 7C illustrates an HH' cross-sectional view of FIG. 7A consistent with disclosed embodiments.

FIG. 7A illustrates a top view of another organic light-emitting display panel consistent with disclosed embodiments. FIG. 7B illustrates a GG' cross-sectional view of FIG. 7A consistent with disclosed embodiments. FIG. 7C illustrates an HH' cross-sectional view of FIG. 7A consistent with disclosed embodiments. As shown in FIG. 7A-FIG. 7C, the disclosed organic light-emitting element array substrate may include a display region 21 (a region outlined by a dashed box in FIG. 7A) and a non-display region 22 (a region outside of the dashed box in FIG. 7A) surrounding the display region 21. The thin film encapsulation layer 12 may be disposed in the display region 21, and may include the first inorganic layer 121, the first organic layer 122, the second inorganic layer 123, the second organic layer 124, and the third inorganic layer 125.

In particular, the organic layers (the first organic layer 122 and the second organic layer 124) with the first groove structures 13 may configure a slope structure 23 in the non-display region 22. A plurality of touch-control lead wires 24 may be disposed in the slope structure 23. One ends of the plurality of touch-control lead wires 24 may, respectively, be electrically connected to the corresponding touch-control electrodes 14 (the first touch-control electrodes 141 and the second touch-control electrodes 142), and the other ends of the plurality of touch-control lead wires may, respectively, be electrically connected to a corresponding driving-chip interface or a flexible circuit board.

Figure 8A:
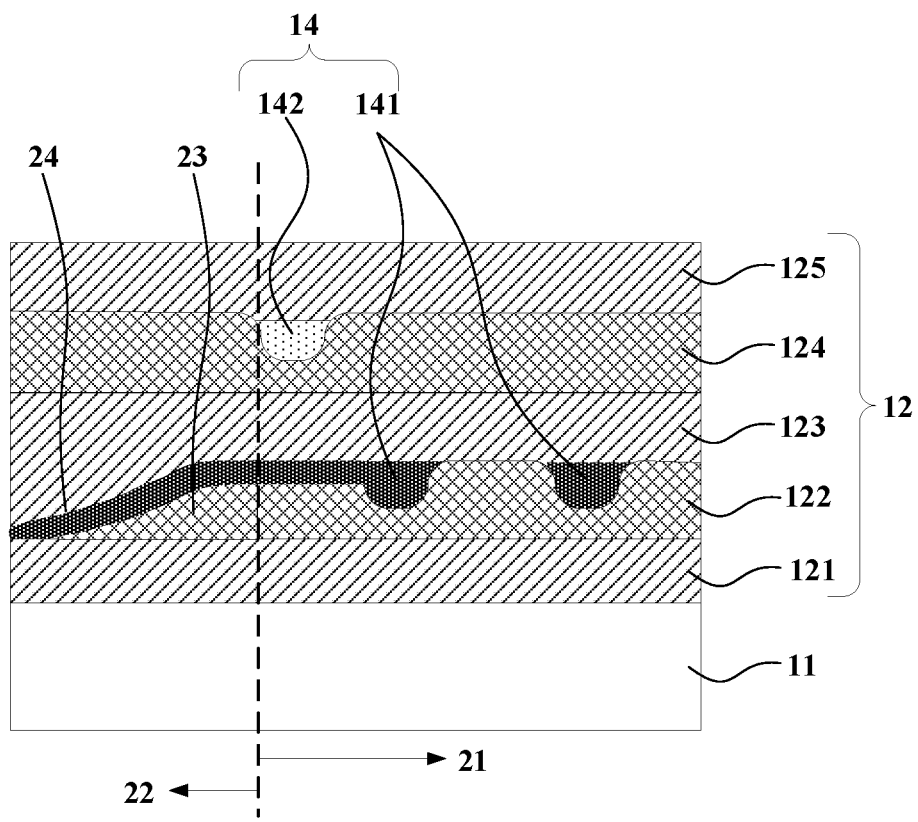
FIG. 8A illustrates another GG' cross-sectional view of FIG. 7A consistent with disclosed embodiments.
Figure 8B:
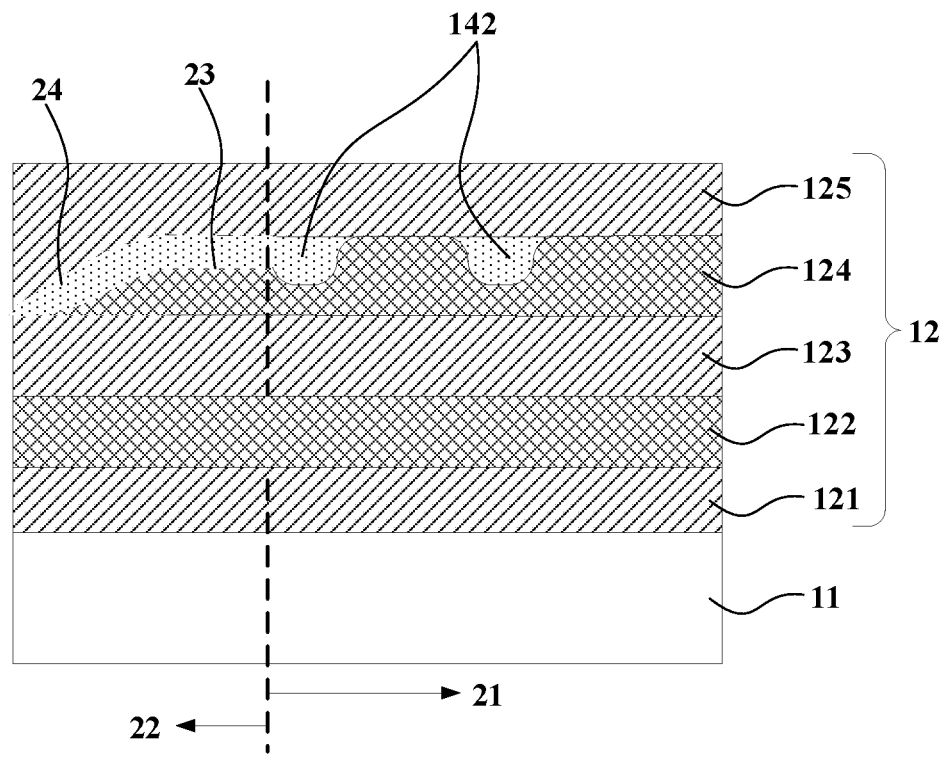
FIG. 8B illustrates another HH' cross-sectional view of FIG. 7A consistent with disclosed embodiments.

FIG. 8A illustrates another GG' cross-sectional view of FIG. 7A consistent with disclosed embodiments. FIG. 8B illustrates another HH' cross-sectional view of FIG. 7A consistent with disclosed embodiments. Optionally, as shown in FIG. 8A and FIG. 8B, second groove structures (not shown) may be disposed in the slope structure 23, and the sidewalls of the second groove structures may be arc-shaped. The plurality of touch-control lead wires 24 may be disposed in the second groove structures. In one embodiment, the second groove structures may be disposed in the slope structure 23, and the plurality of touch-control lead wires 24 may be disposed in the second groove structures. Thus, the issue that the touch-control lead wires 24 need to climb the slope caused by the height difference between the slope structure 23 and the first groove structures may be avoided. Referring to FIG. 8A and FIG. 8B, because the touch-control lead wires 24 no longer need to climb the slope, the breakup of the touch-control lead wires 24 during the bending process may be avoided.

Optionally, the depth of the second groove structures may be greater than the thickness of the touch-control lead wires 24. The width of the second groove structure may be greater than the width of the touch-control lead wires 24. The arc-shaped sidewalls of the second groove structures may also be convex arc-shaped. The depth of the second groove structures may be the same as, or different from the depth of the first groove structures.

Further, the disclosed organic light-emitting element array substrate may include a plurality of light-emitting units arranged in an array. Spacer regions may exist between the plurality of light-emitting units. If the orthographic projections of the first groove structures on the organic light-emitting element array substrate are in a grid pattern, optionally, the vertical projections of the first groove structures on the organic light-emitting element array substrate may be inside the spacer regions. Accordingly, the grid-patterned metal wire touch-control electrodes disposed in the first groove structures may be prevented from occupying the light-emitting regions.

Further, the width of the first groove structures may be configured according to the size of the spacer regions. Optionally, the width of each groove in the first groove structures may be within the range of approximately 5-20 μm, and the distance between adjacent grooves in the first groove structures may be within the range of approximately 30-500 μm.

The present disclosure also provides a method for fabricating an organic light-emitting display panel. The method may include forming an organic light-emitting element array substrate, and forming a thin film encapsulation layer on the organic light-emitting element array substrate. In particular, forming the thin film encapsulation layer on the organic light-emitting element array substrate may include forming at least one inorganic layer and at least one organic layer. First groove structures may be disposed in at least one organic layer, and the sidewalls of the first groove structures may be arc-shaped. Further, touch-control electrodes may be formed in the first groove structures.

By configuring the touch-control electrodes in the thin film encapsulation layer, the corrosion of the touch-control electrodes induced by external water vapor, oxygen, etc. may be avoided. At the same time, the thickness of the organic light-emitting display panels may not be increased continuously, which satisfies the thinning development trend. Further, by configuring the touch-control electrodes in the first groove structures in an organic layer of the thin film encapsulation layer, the risk of the touch-control electrodes being fractured in the bending process may be significantly reduced. Further, because the sidewalls of the first groove structures are arc-shaped, the touch-control electrodes configured in the first groove structures may have a relatively smooth and fitting contact with the first groove structures. Accordingly, the stress concentration issue occurred at the sidewalls of the first groove structures may be avoided, and the risk of the touch-control electrode being fractured during the bending process may be further reduced.

Figure 9:
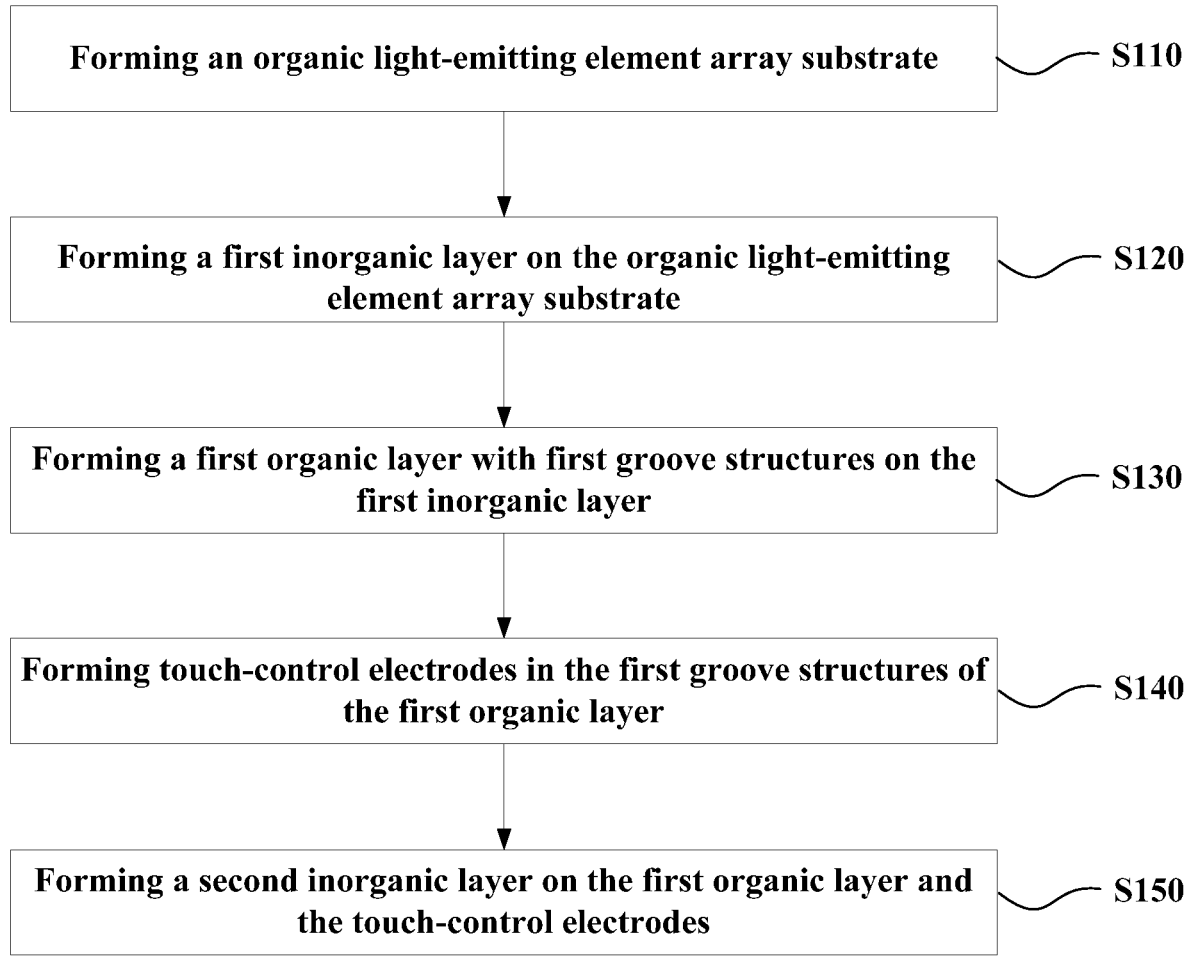
FIG. 9 illustrates a flow chart of a fabrication method of an exemplary organic light-emitting display panel consistent with disclosed embodiments.

FIG. 9 illustrates a flow chart of a method for fabricating an exemplary organic light-emitting display panel consistent with disclosed embodiments. As shown in FIG. 9, the method may include forming an organic light-emitting element array substrate (S110), and forming a first inorganic layer on the organic light-emitting element array substrate (S120).

The method may further include forming a first organic layer with first groove structures in the first inorganic layer (S130), forming touch-control electrodes in the first groove structures of the first organic layer (S140), and forming a second inorganic layer on the first organic layer and the touch-control electrodes (S150). In particular, the first organic layer with the first groove structures may be formed via an ink-jet printing process. The touch-control electrodes in the first groove structures may be disposed via an ink-jet printing process or an etching process.

In particular, the touch-control electrodes formed in the first groove structures may be self-capacitive touch-control electrodes. Referring to FIG. 1A and FIG. 1B, the touch-control electrodes may, for example, include a plurality of touch-control electrode blocks, and the material of the touch-control electrode may be a transparent metallic oxide such as ITO, etc. Optionally, referring to FIG. 2A and FIG. 2B, the touch-control electrodes may be grid-patterned metal wires.

Further, the touch-control electrodes may include a plurality of first touch-control electrodes and a plurality of second touch-control electrodes. The plurality of the first touch-control electrodes and the plurality of second touch-control electrodes may be disposed on the same layer, thus forming a mutual capacitive touch-control structure. Specifically, the first touch-control electrodes and the second touch-control electrodes may be disposed in different groove structures in the same organic layer. The first touch-control electrodes and the second touch-control electrodes may, for example, be transparent and conductive thin films made of ITO, etc. (as shown in FIG. 3A and FIG. 3B), or grid-patterned metal wires (as shown in FIG. 4A and FIG. 4B).

Figure 10:
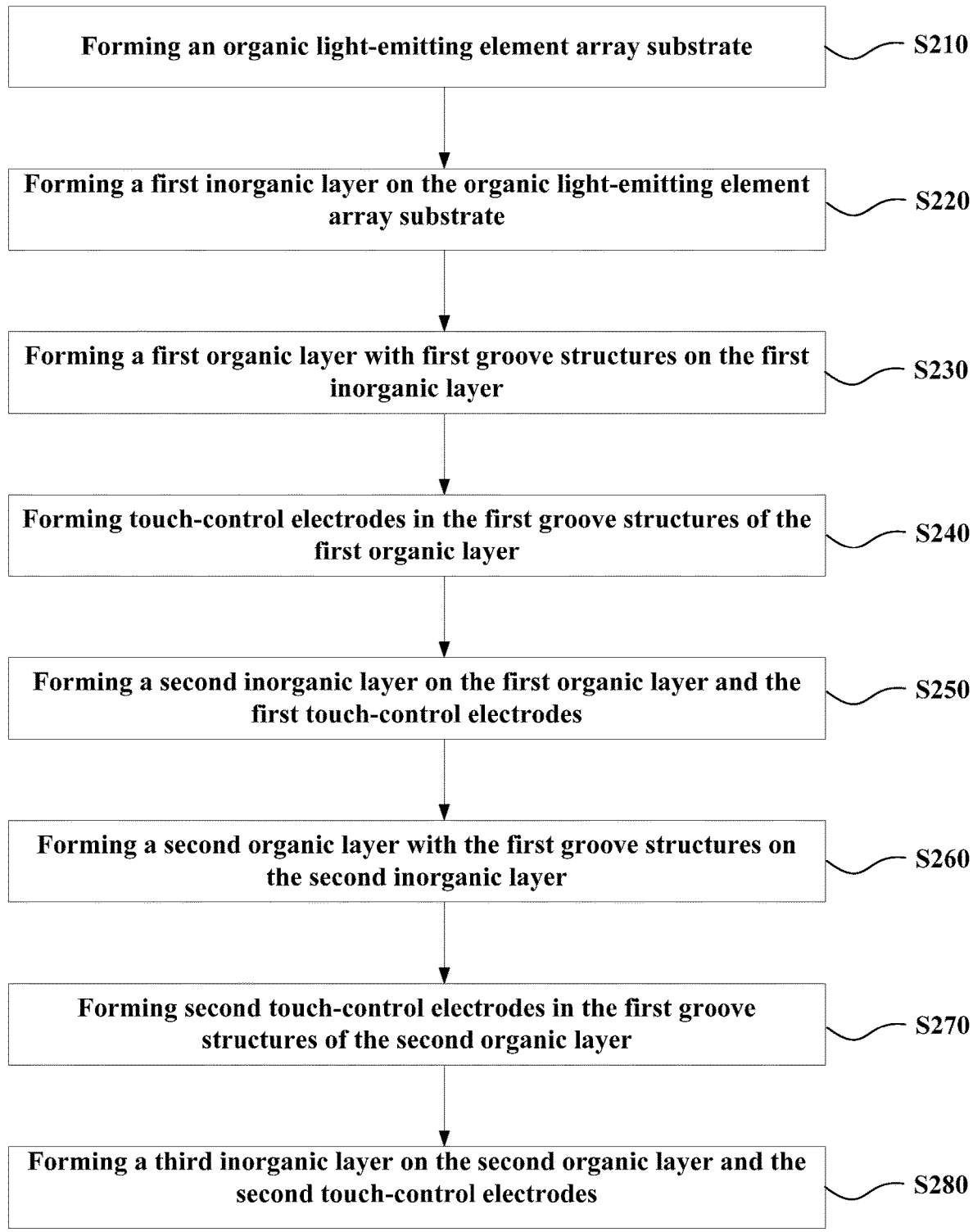
FIG. 10 illustrates a flow chart of another fabrication method of an exemplary organic light-emitting display panel consistent with disclosed embodiments.

FIG. 10 illustrates a flow chart of another method for fabricating an exemplary organic light-emitting display panel consistent with disclosed embodiments. A shown in FIG. 10, the method may include forming an organic light-emitting element array substrate (S210), and forming a first inorganic layer on the organic light-emitting element array substrate (S220).

The method may further include forming a first organic layer with first groove structures in the first inorganic layer (S230), forming first touch-control electrodes in the first groove structures of the first organic layer (S240), and forming a second inorganic layer on the first organic layer and the touch-control electrodes (S250). In particular, the first organic layer with the first groove structures may be formed via an ink-jet printing process. The touch-control electrodes in the first groove structures of the first organic layer may be disposed via an ink-jet printing process or an etching process.

The method may further include forming a second organic layer with the first groove structures on the second inorganic layer (S260), forming second touch-control electrodes in the first groove structures of the second organic layer (S270), and forming a third inorganic layer on the second organic layer and the second touch-control electrodes (S280). In particular, the second organic layer with the first groove structures may be formed via an ink-jet printing process. The touch-control electrodes in the first groove structures of the second organic layer may be disposed via an ink-jet printing process or an etching process.

The disclosed organic light-emitting display panel may also be a mutual capacitive touch-control display panel. In particular, the sidewalls of the first groove structures in the first organic layer and the first groove structures in the second organic layer may all be arc-shaped. The first touch-control electrodes may be disposed in the first groove structures of the first organic layer. The second touch-control electrodes may be disposed in the first groove structure of the second organic layer. The first touch-control electrodes and the second touch-control electrode may be transparent and conductive thin films (as shown in FIG. 5A and FIG. 5B) made of ITO, etc., or grid-patterned metal wires (as shown in FIG. 6A an FIG. 6B).

Optionally, the first groove structures in the first organic layer may have the same structure as the first touch-control electrodes. For example, the orthographic projections of the first groove structures in the first organic layer on the organic light-emitting element array substrate may be in a grid pattern, and the first touch-control electrodes may be grid-patterned metal wires. The first groove structures in the second organic layer may have the same shape as the second touch-control electrodes. For example, the orthographic projections of the first groove structures in the second organic layer on the organic light-emitting element array substrate may be in a grid pattern, and the second touch-control electrodes may be grid-patterned metal wires.

Optionally, the present disclosure may configure the depth of the first groove structures to be greater than the thickness of the touch-control electrodes. Thus, damages to the touch-control electrodes caused by an external force or blast may be avoided. Optionally, the depth of the first groove structures may be configured to be within the range of approximately 0.3-16 μm. The width of each groove in the first groove structures may be greater than the width of the corresponding touch-control electrode disposed in each groove.

Optionally, the present disclosure may form the first groove structures in the organic layer by an etching process. Specifically, the first groove structures may be formed in the organic layer by spin-coating, exposing, developing, photo-etching and stripping a photoresist sequentially.

Optionally, the present disclosure may form the organic layer with the first groove structures via an ink-jet printing process. Different from forming the first groove structures in the organic layer by the etching process, the ink-jet printing process may prevent the thin film encapsulation layer from being damaged by the acidic and alkaline etchants in the etching process. Further, the deterioration of the performance of the organic light-emitting elements caused by light irradiation during photoetching may be avoided.

Figure 11:
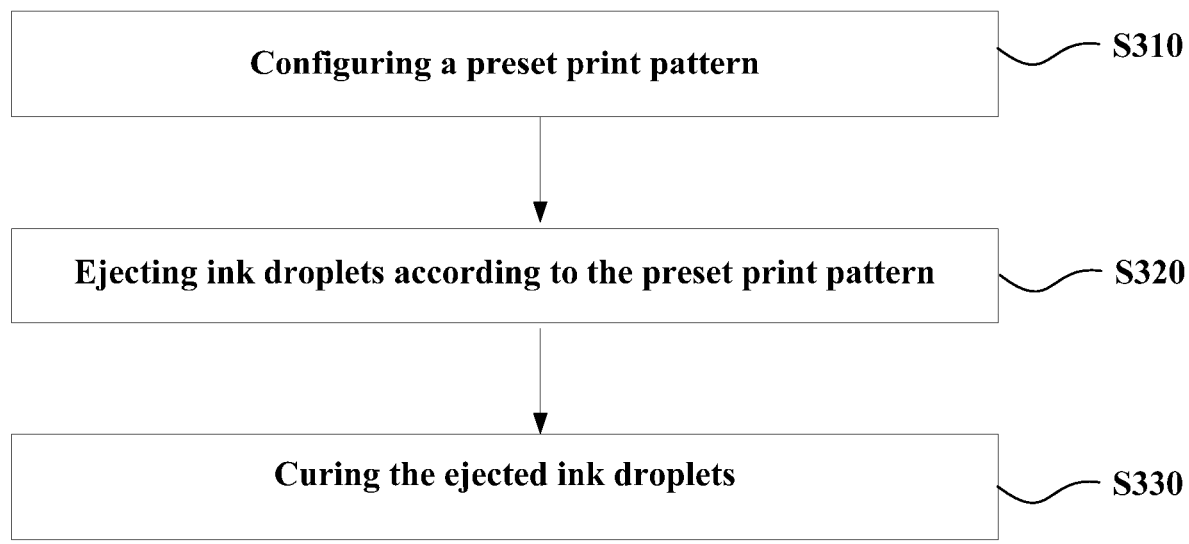
FIG. 11 illustrates a flow chart of forming an organic layer with first groove structures via an ink-jet printing process consistent with disclosed embodiments.

FIG. 11 illustrates a flow chart of forming an organic layer with first groove structures via an ink-jet printing process consistent with disclosed embodiments. As shown in FIG. 11, the method may include configuring a preset print pattern (S310). Optionally, a user may configure the preset print pattern based on the requirements of specific products. For example, the pattern of the organic layer having the first groove structures may be stored in the ink-jet printing device in advance.

The method may further include ejecting the ink droplets according to the preset print pattern (S320). A plurality of methods may be applied to carry out ink droplet ejection according to the preset print pattern. For example, according to the preset print pattern, the moving path of at least one nozzle of the ink-jet printer and the on-and-off of at least one nozzle may be controlled to form the organic layer with the first groove structures. That is, the organic light-emitting element array substrate may be fixed, and the movement of the nozzle of the ink-jet printer may be controlled according to the preset print pattern. Optionally, according to the preset print pattern, the moving path of the organic light-emitting element array substrate and the on-and-off of at least one nozzle of the ink-jet printer may be controlled to form the organic layer with the first groove structures. That is, the nozzle of the ink-jet printer may be fixed, and the movement of the organic light-emitting element array substrate may be controlled according to the preset pattern.

Optionally, the organic layer with the first groove structures may also be formed by configuring the preset print pattern and controlling the on-and-off of a plurality of nozzles arranged in an array according to the preset print pattern. That is, the organic light-emitting element array substrate and the nozzles of the ink-jet printer are all fixed, and the organic layer with the first groove structures may be formed by controlling the on-and-off of the plurality of nozzles arranged in an array. The present disclosure is not intended to limit the number of the nozzles in the ink-jet printer.

Optionally, the distance between adjacent grooves in the first groove structures may be adjusted by controlling the size of the ejected ink droplets and/or the speed of the ejected ink droplets. For example, the larger the ejected ink droplets and the higher the speed of the ejected ink droplets, the greater the distance between the adjacent grooves in the first groove structures.

The method may further include curing the ejected ink droplets (S330). Optionally, curing the ejected ink droplets may, for example, be thermal curing or ultraviolet curing. Specifically, the curing may be performed by controlling the temperature or using the ultraviolet for irradiation. Further, the depth and width of the first groove structures may be adjusted by controlling the curing temperature and/or the curing duration. Optionally, the depth and width of the first groove structures may be adjusted by controlling the strength and duration of the ultraviolet radiation. By controlling the curing duration, the curing temperature, the speed and size of the ink droplets ejected during the ink-jet printing, the shape of the first groove structures in the organic layer may be controlled. For example, the shape of the sidewalls of the first groove structures may be configured to be a convex arc-shape.

Optionally, the orthographic projections of the first groove structures on the organic light-emitting element array substrate may be in a grid pattern. The organic layer having the first groove structures may be formed by converging and aggregating the ejected ink droplets.

Optionally, forming the touch-control electrodes in the first groove structures may include forming the touch-control electrodes in the first groove structures via an ink-jet printing process or an etching process. Optionally, to simply the processing process, the organic layer and the touch-control electrodes in the thin film encapsulation layer may all be formed by the ink-jet printing process.

Specifically, a patterned organic layer (i.e., the organic layer with the first groove structures) may be formed by the ink-jet printing process, and the touch-control electrodes may be formed in the first groove structures in the organic layer via the ink-jet printing process. Optionally, forming the touch-control electrodes in the first groove structures via the ink-jet printing process may include ejecting the ink droplets in the first groove structures by controlling the on-and-off of the plurality of nozzles arranged in an array.

Because touch-control lead wires need to be configured for the touch-control electrodes, the touch-control electrodes may be electrically connected to a corresponding driving-chip interface or a flexible circuit board. Optionally, when forming the organic layer in the thin film encapsulation layer, the organic layer with the first groove structures may be formed on the organic light-emitting element array substrate, and a slope structure may be formed when the organic layer extends into the non-display region of the organic light-emitting element array substrate.

When or after forming the touch-control electrodes in the first groove structures, a plurality of touch-control lead wires may be formed in the slope structure. One ends of the plurality of touch-control lead wires may, respectively, be electrically connected to the corresponding touch-control electrodes, and the other ends of the plurality of touch-control lead wires may, respectively, be electrically connected to the corresponding driving chip interface or the flexible circuit board. If the touch-control electrodes are grid-patterned metal wires, the touch-control lead wires and the touch-control electrodes may be formed using the same material in the same processing process.

To avoid the formation of a height difference between the slope structure and the first groove structures that leads to easy breakup of the touch-control lead wires, optionally, second groove structures may be formed in the slope structure. The sidewalls of the second groove structures may be arc-shaped, and a plurality of touch-control lead wires may be disposed in the second groove structures. Optionally, the first groove structures and the second groove structures may be formed at the same time. The depth of the second groove structures may be greater than the thickness of the touch-control lead wires. The width of the second groove structures may be greater than the width of the touch-control lead wires. The sidewalls of the second groove structures may also be convex arc-shaped. Further, the depth of the second groove structures may be the same as, or different from the first groove structures.

The disclosed organic light-emitting element array substrate may include a plurality of light-emitting units arranged in an array. Spacer regions may be configured between the plurality of light-emitting units. If the orthographic projections of the first groove structures on the organic light-emitting element array substrate are in a grid pattern, optionally, the vertical projections of the first groove structures on the organic light-emitting element array substrate may be inside the spacer regions. Accordingly, the grid-patterned metal wire touch-control electrodes disposed in the first groove structures may be prevented from occupying the light-emitting regions.

The width of the first groove structures may be configured according to the size of the spacer regions. Optionally, the width of each groove in the disclosed first groove structures may be within the range of approximately 5-20 µm, and the distance between the adjacent grooves in the first groove structures may be within the range of approximately 30-500 µm.

By using the disclosed organic light-emitting display panel, the touch-control electrodes may be disposed in first groove structures in an organic layer of the thin film encapsulation layer. Thus, the risk of the touch-control electrodes being fractured in the bending process may be significantly reduced. Further, because the sidewalls of the first groove structures are arc-shaped, the touch-control electrodes disposed in the first groove structures may have a relatively smooth and fitting contact with the first groove structures. Accordingly, stress concentration at the sidewalls of the first groove structures may be avoided, and the risk of the touch-control electrodes being fractured may be further reduced.

It should be noted that, the above detailed descriptions illustrate only preferred embodiments of the present disclosure and technologies and principles applied herein. Those skilled in the art can understand that the present disclosure is not limited to the specific embodiments described herein, and numerous significant alterations, modifications and alternatives may be devised by those skilled in the art without departing from the scope of the present disclosure. Thus, although the present disclosure has been illustrated in above-described embodiments in detail, the present disclosure is not limited to the above embodiments. Any equivalent or modification thereof, without departing from the spirit and principle of the present invention, falls within the true scope of the present invention, and the scope of the present disclosure is defined by the appended claims.

What is claimed is:

1. An organic light-emitting display panel, comprising:
   an organic light-emitting element array substrate;
   a thin film encapsulation layer covering the organic light-emitting element array substrate; and
   a plurality of first touch-control electrodes and a plurality of functionally different second touch-control electrodes, wherein:
      the thin film encapsulation layer includes at least one inorganic layer and at least one organic layer,
      a plurality of first groove structures with arc-shaped sidewalls are configured in the at least one organic layer, and each of the arc-shaped sidewalls has an arc-shaped top end and an arc-shaped bottom end, and the arc-shaped top end and the arc-shaped bottom end curves inward and outward, respectively, and
      the plurality of first touch-control electrodes and the plurality of functionally different second touch-control electrodes disposed in different first groove structures located in a same organic layer of the at least one organic layer.

2. The organic light-emitting display panel according to claim 1, wherein:
   the plurality of touch-control electrodes include a plurality of touch-control electrode blocks disposed in the plurality of first groove structures in a same organic layer.

3. The organic light-emitting display panel according to claim 1, wherein:
   the plurality of touch-control electrodes include a plurality of grid-pattern metal wires disposed in the plurality of first groove structures in a same organic layer.

4. The organic light-emitting display panel according to claim 1, wherein:
   the plurality of first touch-control electrodes are continuous in a column direction and are isolated from each other in a row direction; and
   two adjacent second touch-control electrodes in a row are spaced apart by a column of first touch-control electrodes.

5. The organic light-emitting display panel according to claim 4, wherein:

the two adjacent second touch-electrodes in a row spaced apart by a column of first touch-control electrodes are electrically connected via a crossing bridge structure.

6. The organic light-emitting display panel according to claim 5, further comprising:
an insulation layer disposed in an overlapping region between crossing bridge structures and the plurality of first touch-control electrodes, to ensure that the plurality of first touch-control electrodes and the plurality of second touch-control electrodes disposed in the same organic layer are mutually insulated.

7. The organic light-emitting display panel according to claim 1, wherein:
the plurality of first touch-control electrodes are touch-control driving electrodes and the plurality of second touch-control electrodes are touch-control sensing electrodes.

8. The organic light-emitting display panel according to claim 1, wherein:
the organic light-emitting element array substrate includes a display region and a non-display region surrounding the display region;
the at least one organic layer configures a slope structure in the non-display region; and
a plurality of touch-control lead wires are disposed in the slope structure, one ends of the plurality of touch-control lead wires are electrically connected to the plurality of touch-control electrodes in the at least one organic layer, respectively, and the other ends of the plurality of touch-control lead wires are electrically connected to a corresponding driving-chip interface or a flexible circuit board.

9. The organic light-emitting display panel according to claim 8, wherein:
a plurality of second groove structures are configured in the slope structure, each of the plurality of second groove structures is in one of the at least one inorganic layer adjacent to the same organic layer of the at least one organic layer, sidewalls of the plurality of second groove structures are arc-shaped, and the plurality of touch-control lead wires are disposed in the plurality of second groove structures.

10. The organic light-emitting display panel according to claim 1, wherein:
each of the plurality of first touch-control electrodes partially fills in a corresponding first groove structure of the plurality of first groove structures and has a top surface lower than a top surface of the at least one organic layer.

11. A method for fabricating an organic light-emitting display panel, comprising:
forming an organic light-emitting element array substrate;
forming a thin film encapsulation layer on the organic light-emitting element array substrate, wherein forming the thin film encapsulation layer on the organic light-emitting element array substrate includes forming at least one inorganic layer and at least one organic layer on the organic light-emitting element array substrate;
configuring a plurality of first groove structures with arc-shaped sidewalls in the at least one organic layer, wherein each of the arc-shaped sidewalls has an arc-shaped top end and an arc-shaped bottom end, and the arc-shaped top end and the arc-shaped bottom end curves inward and outward, respectively; and disposing a plurality of first touch-control electrodes and a plurality of functionally different second touch-control electrodes in different first groove structures in a same organic layer of the at least one organic layer.

12. The method according to claim 11, wherein forming the plurality of touch-control electrodes in the plurality of first groove structures further includes:
forming a plurality of touch-control electrode blocks in the plurality of first groove structures.

13. The method according to claim 11, wherein forming the plurality of touch-control electrodes in the plurality of first groove structures further includes:
forming a plurality of grid-pattern metal wires in the plurality of first groove structures.

14. The method according to claim 11, wherein:
forming the organic light-emitting element array substrate further includes forming a display region and a non-display region surrounding the display region,
configuring a slope structure in the non-display region when forming the at least one inorganic layer; and
the method further includes:
disposing a plurality of touch-control lead wires in the slope structure,
electronically connecting one ends of the plurality of touch-control lead wires to the plurality of touch-control electrodes in the plurality of first groove structures, respectively, and
electronically connecting the other ends of the plurality of touch-control lead wires to a corresponding driving-chip interface or a flexible circuit board.

15. The method according to claim 14, wherein the plurality of touch-control lead wires and the plurality of touch-control electrodes are formed using a same material in a same processing process.

16. The method according to claim 11, wherein disposing the plurality of first touch-control electrodes and the plurality of functionally different second touch-control electrodes in different first groove structures in the same organic layer further includes:
disposing the plurality of first touch-control electrodes continuously in a column direction isolated from each other in a row direction; and
spacing apart two adjacent second touch-control electrodes in a row by a column of first touch-control electrodes.

17. The method according to claim 11, wherein:
the plurality of first touch-control electrodes are touch-control driving electrodes and the plurality of second touch-control electrodes are touch-control sensing electrodes.

18. The method according to claim 11, wherein:
the at least one organic layer with the plurality of first groove structures is formed via an ink-jet printing process.

19. The method according to claim 18, wherein forming the at least organic layer with the plurality of first groove structures via an ink-jet printing process further includes:
configuring a preset print pattern;
ejecting ink droplets according to the preset print pattern; and
curing the ejected ink droplets.

20. The method according to claim 11, wherein:
the plurality of first groove structures are formed in the at least one organic layer via an etching process.

* * * * *